(12) United States Patent
Higashino (10) Patent No.: US 7,079,429 B2
(45) Date of Patent: Jul. 18, 2006

(54) SEMICONDUCTOR MEMORY DEVICE (75) Inventor: Hirofumi Higashino, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 32 days.

(21) Appl. No.: 11/004,391

(22) Filed: Dec. 3, 2004

(65) Prior Publication Data
US 2005/0122756 A1   Jun. 9, 2005

(30) Foreign Application Priority Data
Dec. 4, 2003   (JP)  ............................. 2003-405369

(51) Int. Cl.
*G11C 7/00* (2006.01)
(52) U.S. Cl. .................. 365/195; 365/185.28
(58) Field of Classification Search ............... 365/195, 365/185.28, 185.29, 196
See application file for complete search history.

(56) References Cited

U.S. PATENT DOCUMENTS

| | | | | |
|---|---|---|---|---|
| 4,744,062 A | * | 5/1988 | Nakamura et al. ..... | 365/185.04 |
| 5,506,806 A | * | 4/1996 | Fukushima ................ | 365/195 |
| 5,973,956 A | * | 10/1999 | Blyth et al. ............. | 365/185.03 |
| 6,804,150 B1 | * | 10/2004 | Park et al. ............. | 365/185.18 |
| 2005/0213388 A1 | * | 9/2005 | Yamada ................... | 365/185.22 |

FOREIGN PATENT DOCUMENTS

| | | |
|---|---|---|
| JP | 63-68948 | 3/1988 |
| JP | 1-103752 | 4/1989 |

* cited by examiner

Primary Examiner—Anh Phung
(74) Attorney, Agent, or Firm—Morrison & Foerster LLP (57) ABSTRACT There is provided a semiconductor memory device in which data, stored in a unit data storage section configured by one or more data storage elements, is erased to be formed into a specific erasure data pattern. The semiconductor memory device has a data protection mechanism in which a determination is made as to whether or not data stored in the unit data storage section has the erasure data pattern, and programming of the data into the unit data storage section is inhibited when the data is not in the erasure data pattern. This mechanism can protect already programmed data from being destroyed due to programming error at the time of programming the data.

4 Claims, 6 Drawing Sheets

SEMICONDUCTOR MEMORY DEVICE

CROSS REFERENCE TO RELATED APPLICATIONS

This Nonprovisional application claims priority under 35 U.S.C. § 119(a) on Patent Application No. 2003-405369 filed in Japan on Dec. 4, 2003, the entire contents of which are hereby incorporated by reference.

BACKGROUND OF THE INVENTION

1. Field of the Invention

The present invention relates to a semiconductor memory device having data protection means. More specifically, the present invention relates to a technique for protecting already programmed data.

2. Description of the Related Art

It has been often the case that a nonvolatile semiconductor memory device, such as a flash memory, is used for its advantage of being capable of updating storage contents as a memory device of data or a program code, in place of a conventional read-only memory (ROM).

In nonvolatile semiconductor memory devices capable of updating storage contents, data destruction might occur due to programming or erasure caused by an operation error or a signal error such as a noise (hereinafter described as "programming error" or "erasure error"). Some nonvolatile semiconductor memory devices thus have a data protection function for preventing the programming error and erasure error.

As a first method for data protection in the prior art, there is a method having a mechanism in which a control terminal for data protection is prepared, and programming and erasure are permitted when an input voltage at an "H" (high) level has been applied to the control terminal, whereas programming and erasure are inhibited when an input voltage at an "L" (low) level has been applied to the control terminal. When updating storage contents, the input level of the control terminal for data protection is set to "H" to erase data or program update data. In performing data-reading alone, the input level of the control terminal is set to "L" so as to prevent programming error or erasure error.

As a second method for data protection in the prior art, there is a method having a mechanism in which a storage region in a flash memory or the like is divided into a plurality of blocks, a storage element (hereinafter, referred to as "block protection bit") for recording data protection information corresponding to each of the blocks is prepared, and when "0" has been programmed into the block protection bit, programming or erasure of data into or from the corresponding block is permitted, whereas when "1" has been programmed into the block protection bit, programming or erasure of data into or from the corresponding block is inhibited. When updating data, "0" is programmed into the block protection bit in a block to be updated, to erase the block or program update data into the block. After the data update, "1" is programmed into the block protection bit to prevent the data destruction due to programming error or erasure error.

Further, as a third method for data protection in the prior art, there is a method having a mechanism in which a storage element (hereinafter referred to as "data protection bit") for recording data protection information corresponding to each storage address is prepared, and when "0" has been programmed into the data protection bit, programming of data into the storage address is permitted, whereas when "1" has been programmed into the data protection bit, programming of data into the storage address is prohibited. For example, there are methods for data protection disclosed in JP-A 01-103752 (1989) and JP-A 63-68948 (1988).

In the case of using the above first and second methods in the prior art, there is a problem in that, since data protection is released during data update, already programmed data cannot be protected from being destroyed due to programming error while data protection is released.

In the above first method of the prior art, since programming of data is permitted with the input level of the control terminal set to "H" during data update, already programmed data might be rewritten with another data.

In the above second method of the prior art, a block protection bit, corresponding to a block not to be updated, is set to "1" to protect already programmed data from being rewritten with another data due to programming error. However, since a block protection bit, corresponding to a block to be updated, is set to "0" to permit programming of data, already programmed data might be rewritten with another data due to programming error.

In the above third method of the prior art, already programmed data can be protected by programming "1" into a protection bit corresponding to the already programmed address. However, there is a problem with this method in that each storage address needs a separate data protection bit from each other, thereby to increase a storage element area. In the case of a memory device with a word length of eight bits, for example, a one-bit data protection storage element needs to be added to the eight-bit data storage elements, which increases the storage element area by 12.5%.

SUMMARY OF THE INVENTION

The present invention has been made in consideration of the above problems and its object of the present invention is to provide a semiconductor memory device capable of protecting already programmed data from being destroyed due to programming error.

A semiconductor memory device according to the present invention erases data stored in a unit data storage section configured by one or more data storage elements so that the data after erased is formed into a specific erasure data pattern, and has a data protection mechanism in which programming of data into the unit data storage section is inhibited when the data stored in the unit data storage section is not in the erasure data pattern.

Further, a semiconductor memory device according to the present invention includes a unit data storage section configured by one or more data storage elements, an erasing mechanism for erasing data stored in the unit data storage section to form the data after erased into a specific erasure data pattern, and a data protection mechanism for inhibiting programming of data into the unit data storage section when the data stored in the unit data storage section is not in the erasure data pattern.

According to the semiconductor memory device of the present invention, prior to programming of data into the unit data storage section, the data protection mechanism confirms whether or not data stored in the unit data storage section, object to be programmed, is in a specific erasure data pattern. If the data is not in the erasure data pattern, the data protection mechanism determines the presence of already programmed data, to inhibit programming of data into the unit data storage section, thereby enabling protection of the already programmed data from being destroyed due to programming error. If data stored in the unit data storage section is in the erasure data pattern, the data protection mechanism determines that the unit data storage section has no programmed data, thereby enabling safe programming processing.

DETAILED DESCRIPTION OF THE PREFERRED EMBODIMENTS

One embodiment of the semiconductor memory device according to the present invention (hereinafter, appropriately referred to as "the inventive device") will be described on the basis of drawings.

First, an operation of an existing flash memory will be briefly described prior to the description of the inventive device.

Data can be erased from and programmed into a flash memory cell capable of storing one-bit data. When data is erased, cell data has a state of "1". When data is programmed, the cell data has a state of "0".

Since data is usually erased block by block, cell data of all memory cells in a block which has been erased have the state of "1".

Data can be programmed on a storage address basis. However, in programming, the state of the cell data cannot be changed from "0" to "1" while can be changed from "1" to "0". For example, when "0Fh" (hereinafter a hexadecimal form is indicated ending with "h") is programmed into an address 0 of a flash memory, which has the data "FFh" after erased, the data changes to "0Fh". If "F0h" is programmed into the address 0 in this state, the data in the address 0 is not changed to "F0h", but to "00h". For updating the data in the address 0 from "0Fh" to "F0h", it is necessary to erase the address 0 to have the data "FFh" before programming of "F0h".

Therefore, in typical data update in a flash memory, a block to be updated is erased before programming of data update.

First Embodiment

Next, a configuration and data protection function of a first embodiment of the inventive device will be described with reference to FIGS. 1 and 2.

The inventive device is a semiconductor memory device using a flash memory cell, a nonvolatile storage element, as a memory cell (corresponding to a data storage element). As shown in FIG. 1, the inventive device 1 according to the first embodiment is configured to comprise: a memory array 10, an X decoder 12, a Y decoder 13, a sense amplifier 14, a control circuit 15, a protection determining circuit 16, and an I/O circuit 17.

Figure 1:
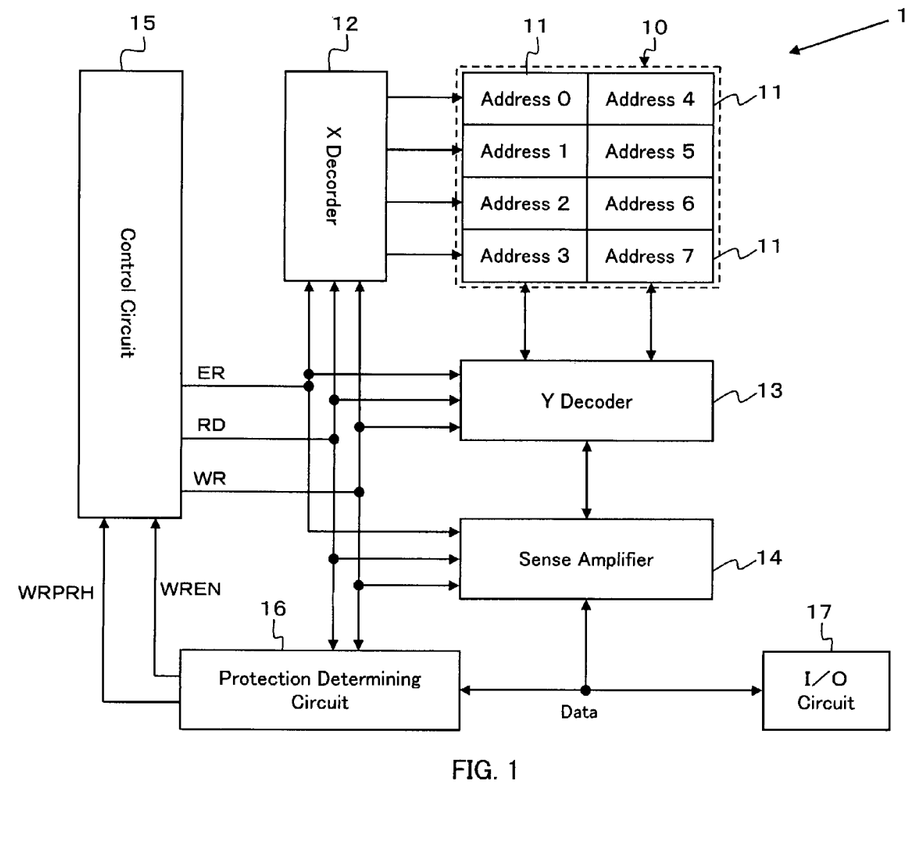
FIG. 1 is a block diagram showing a circuit configuration of a first embodiment of a semiconductor memory device according to the present invention.

In the example shown in FIG. 1, it is assumed for the sake of simplifying the description that the memory array 10 constituting a storage region in the inventive device 1 includes eight unit data storage sections 11 with respective storage addresses 0 to 7. Each of the unit data storage sections 11 is capable of storing data with a word length of eight bits and is formed by gatherings of eight memory cells (not shown) capable of storing one-bit data.

The unit data storage sections 11 with the respective storage addresses 0 to 7 constitute one erasure block (one erasure unit). Hence, when the block is erased, each of the unit data storage sections 11 has the data "FFh". In the case of the present embodiment, this data "FFh" after erasure of the block is the erasure data pattern in the present invention.

The X decoder 12 and the Y decoder 13 select one unit data storage section 11 corresponding to a storage address designated by an address signal.

The sense amplifier 14 serves as a circuit for separately reading, in a bit unit, eight-bit data from the unit data storage section 11. In the present embodiment, the sense amplifier 14 also serves as a circuit for separately programming, in a bit unit, eight-bit data into the unit data storage section 11.

The I/O circuit 17 outputs data read from the unit data storage section 11 via the sense amplifier 14, and inputs data programmed into the unit data storage section 11 via the sense amplifier 14.

The protection determining circuit 16 generates a WREN signal to permit programming of data into the unit data storage section 11 when the data read from the unit data storage section 11 via the sense amplifier 14 has the erasure data pattern "FFh". If the read data is in any pattern other than the erasure data pattern, the protection determining circuit 16 generates a WRPRH signal to inhibit programming of data into the unit data storage section 11.

The control circuit 15 generates an RD signal, an ER signal and a WR signal to control a reading process, an erasure process and a programming process.

Upon generation of the RD signal, data in the unit data storage section 11 corresponding to a selected storage address is read via the sense amplifier 14, to be sent to the I/O circuit 17 and the protection determining circuit 16.

Upon generation of the ER signal, data in all unit data storage sections 11 with the different addresses (memory array 10) are erased to have the erasure data pattern "FFh".

Upon generation of the WR signal, programming data is programmed into the unit data storage section 11 corresponding to a storage address designated by the address signal, from the I/O circuit 17 via the sense amplifier 14.

In the erasure process, the control circuit 15 generates the ER signal to erase data in all unit data storage sections 11 with the different addresses.

In the reading process, the control circuit 15 generates the RD signal, and data read from the unit data storage section 11 corresponding to a storage address designated by the address signal is outputted from the I/O circuit 17 via the sense amplifier 14.

In the programming process, the control circuit 15 generates the RD signal, and data read from the unit data storage section 11 corresponding to a storage address designated by the address signal is sent to the protection determining circuit 16.

If the read data is in the erasure data pattern "FFh", the protection determining circuit 16 generates a WREN signal to permit programming of the data. Upon generation of the WREN signal, the control circuit 15 releases the RD signal to generate the WR signal so that data is programmed into the unit data storage section 11 corresponding to a storage address designated by the address signal.

If the read data is in any pattern other than the erasure data pattern, the protection determining circuit 16 generates a WRPRH signal to inhibit programming of the data. Upon generation of the WRPRH signal, the control circuit 15 releases the RD signal to abandon the programming process.

In the inventive device 1, the case is assumed in which data in the unit data storage section 11 with the address 0 is updated and then a programming error signal is generated thereto. After data in the unit data storage section 11 with the address 0 is erased, the update data "0Fh" is programmed thereinto, and the data "F0h" as a programming error signal is then programmed into the unit data storage section 11 with the address 0. Operations performed in this case will be described below with reference to the timing chart of FIG. 2 showing contents of data in the address 0 and the conditions of the internal signals.

Figure 2:
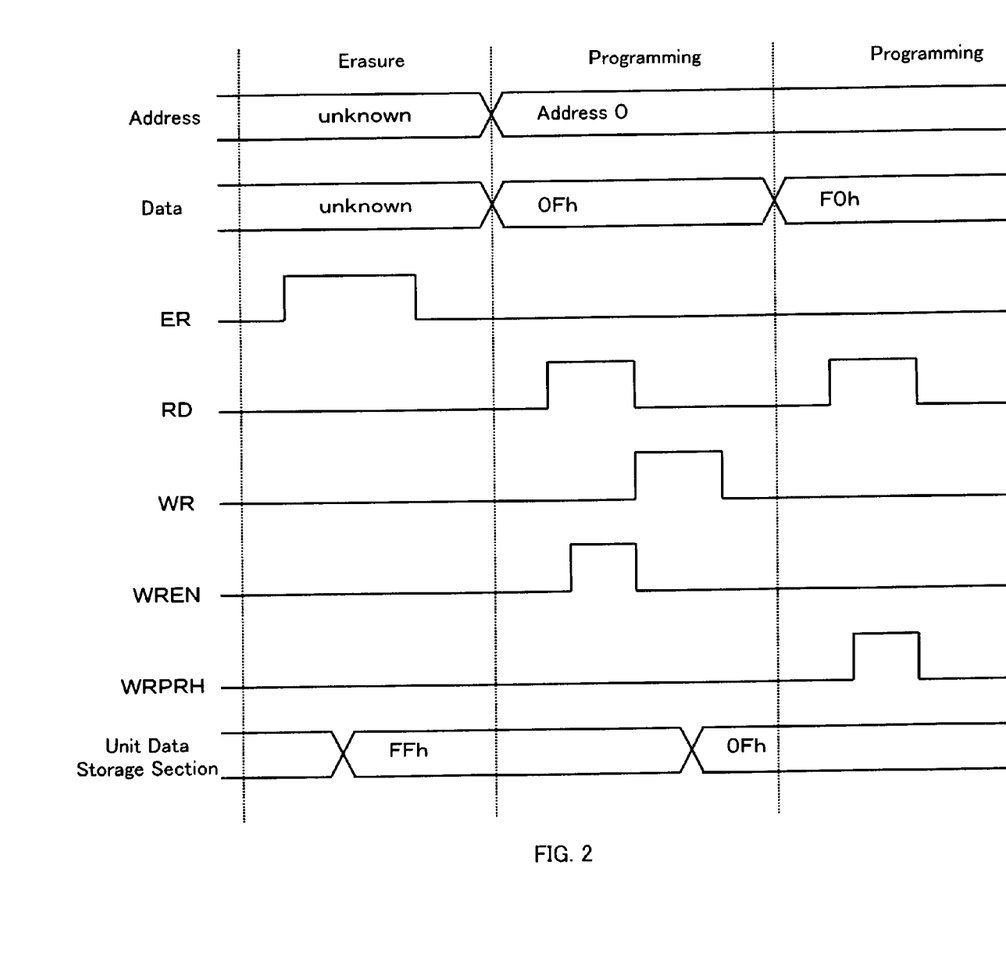
FIG. 2 is a timing chart of an internal signal for explaining a data protection mechanism in the first embodiment of the semiconductor memory device according to the present invention.

The erasure operation in the present embodiment does not require designation of an address or data, as indicated with the term "unknown" in the timing chart of FIG. 2.

First, in the erasure process, the ER signal is generated, and then all the unit data storage sections 11 with the different addresses have "FFh".

Next, in the programming process of the data "0Fh" into the unit data storage section 11 with the address 0, the control circuit 15 generates the RD signal to read data from the unit data storage section 11 with the address 0. At this time, the erasure data pattern "FFh" is read and the protection determining circuit 16 generates the WREN signal. With this signal, the control circuit 15 releases the RD signal and then generates the WR signal to program "0Fh" in the unit data storage section 11 with the address 0.

In the subsequent programming process of the data "F0h" into the unit data storage section 11 with the address 0, the control circuit 15 generates the RD signal to read memory cell data from the address 0. At this time, "0Fh" is read as the memory cell data, and the protection determining circuit 16 generates the WRPRH signal. With this signal, the control circuit 15 releases the RD signal to abandon the programming process. As a result, already programmed data in the unit data storage section 11 with the address 0 is protected from programming error to hold "0Fh".

Second Embodiment

Next, a configuration and data protection function of a second embodiment of the inventive device will be described with reference to FIGS. 3 and 4. The same circuit sections and signals are provided with the same reference numbers as those in FIG. 1 in the first embodiment.

The inventive device is a semiconductor memory device using a flash memory cell, a nonvolatile storage element, as a memory cell (corresponding to a data storage element), as in the first embodiment. As shown in FIG. 3, the inventive device 2 according to the second embodiment is configured to comprise: a memory array 10, an X decoder 12, a Y decoder 13, a sense amplifier 14, an I/O circuit 17, and a control microcontroller 18.

Figure 3:
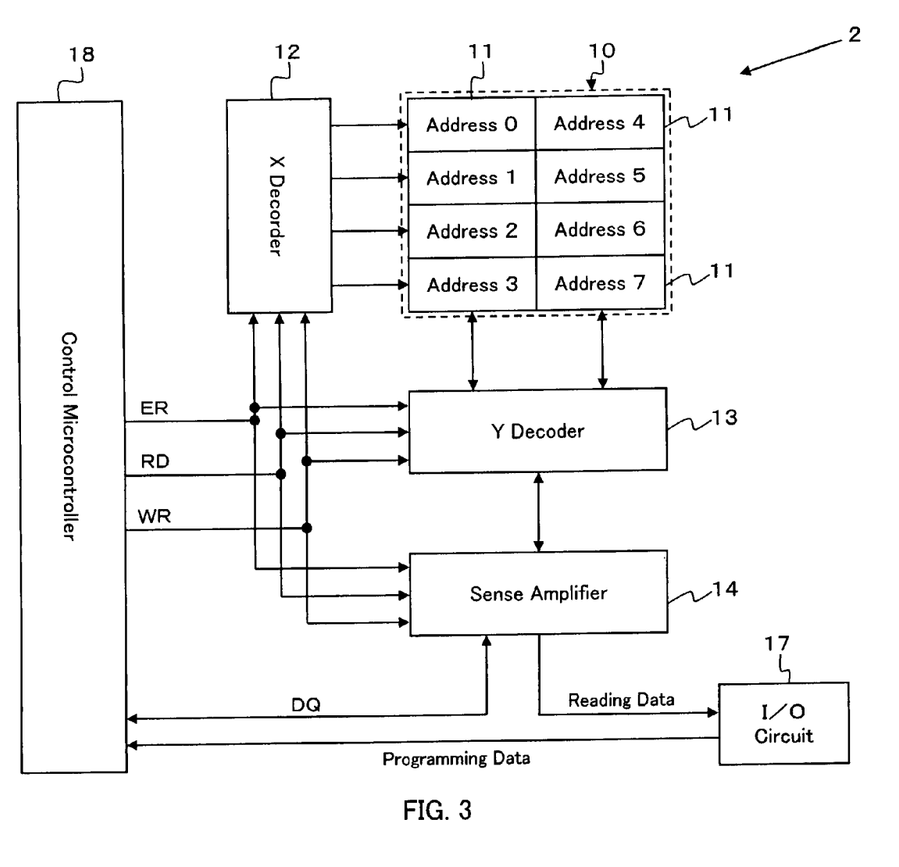
FIG. 3 is a block diagram showing a circuit configuration of a second embodiment of a semiconductor memory device according to the present invention.

In the example shown in FIG. 3, it is assumed for the sake of simplifying the description that the memory array 10 constituting a storage region in the inventive device 2 includes eight unit data storage sections 11 with respective storage addresses 0 to 7. Each of the unit data storage sections 11 is capable of storing data with a word length of eight bits and is formed by gatherings of eight memory cells (not shown) capable of storing one-bit data.

Since the unit data storage sections 11 with all the storage addresses 0 to 7 constitute one erasure block (one erasure unit), when the block is erased, each of the unit data storage sections 11 has the data "FFh". In the case of the present embodiment, this data "FFh" after erasure of the block is the erasure data pattern in the present invention.

The X decoder 12, the Y decoder 13 and the sense amplifier 14 are the same as those in the inventive device 1 according to the first embodiment, and hence the repetition of descriptions of those components is omitted.

The I/O circuit 17 outputs data read from the unit data storage section 11 via the sense amplifier 14, and inputs programming data to be sent to the control microcontroller 18.

The control microcontroller 18 generates an RD signal, an ER signal and a WR signal to control a reading process, an erasure process and a programming process. The control microcontroller 18 also fetches programming data from the I/O circuit 17, or reads and programs data from and into the unit data storage section 11 through a DQ line via the sense amplifier 14.

Upon generation of the RD signal, data in the unit data storage section 11 corresponding to a selected storage address is read via the sense amplifier 14, to be sent to the I/O circuit 17 and the control microcontroller 18.

Upon generation of the ER signal, all the unit data storage sections 11 with the different addresses (memory array 10) are erased to have the erasure data pattern "FFh".

Upon generation of the VVR signal, programming data fetched into the control microcontroller 18 from the I/O circuit 17 is programmed into the unit data storage section 11 corresponding to a storage address designated by the address signal via the sense amplifier 14.

Figure 4:
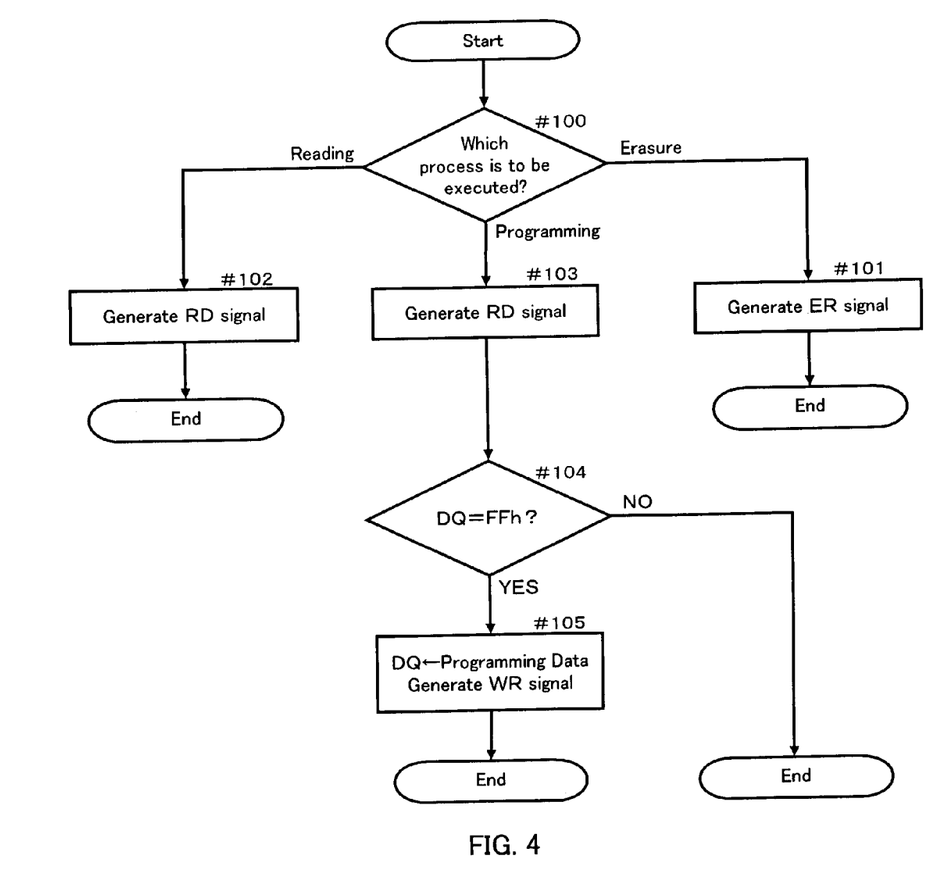
FIG. 4 is a flowchart for explaining an operation of a control microcontroller in the second embodiment of the semiconductor memory device according to the present invention.

FIG. 4 shows a flowchart of operations of the control microcontroller 18.

First, as the operation starts, a determination is made as to which of the processes (reading/erasure/programming) to execute (step #100).

When the process to execute is the erasure process, the control microcontroller 18 generates the ER signal to erase all the unit data storage sections 11 with the different addresses (step #101).

When the process to execute is the reading process, the control microcontroller 18 generates the RD signal, and data read from the unit data storage section 11 corresponding to a storage address designated by the address signal is outputted from the I/O circuit 17 via the sense amplifier 14 (step #102).

When the process to execute is the programming process, the control microcontroller 18 generates the RD signal, and reads data from the unit data storage section 11 corresponding to a storage address designated by the address signal through a DQ line (step #103).

Whether the read data matches the erasure data pattern "FFh" or not is confirmed (step #104). If the data matches the erasure data pattern, the RD signal is released, and the programming data fetched from the I/O circuit 17 is outputted to the DQ line. After this output, the WR signal is generated to program the data into the unit data storage section 11 corresponding to a storage address designated by the address signal (step #105). In step #104, if the read data does not match the erasure data pattern, the RD signal is released to abandon the programming process.

Third Embodiment

Next, a configuration and data protection function of a third embodiment of the inventive device will be described with reference to FIGS. 5 and 6. The same circuit sections and signals are provided with the same reference numbers as those in FIG. 1 or 2.

Even in the case of a memory device using a storage element other than a flash memory cell, data can be protected in a similar manner as in the first and second embodiments above by allowing the device to have a mechanism for programming a specific erasure data pattern. An inventive device 3 according to the third embodiment realizes such data protection by having a mechanism for programming an erasure data pattern into the unit data storage section 11 in the erasure operation.

Figure 5:
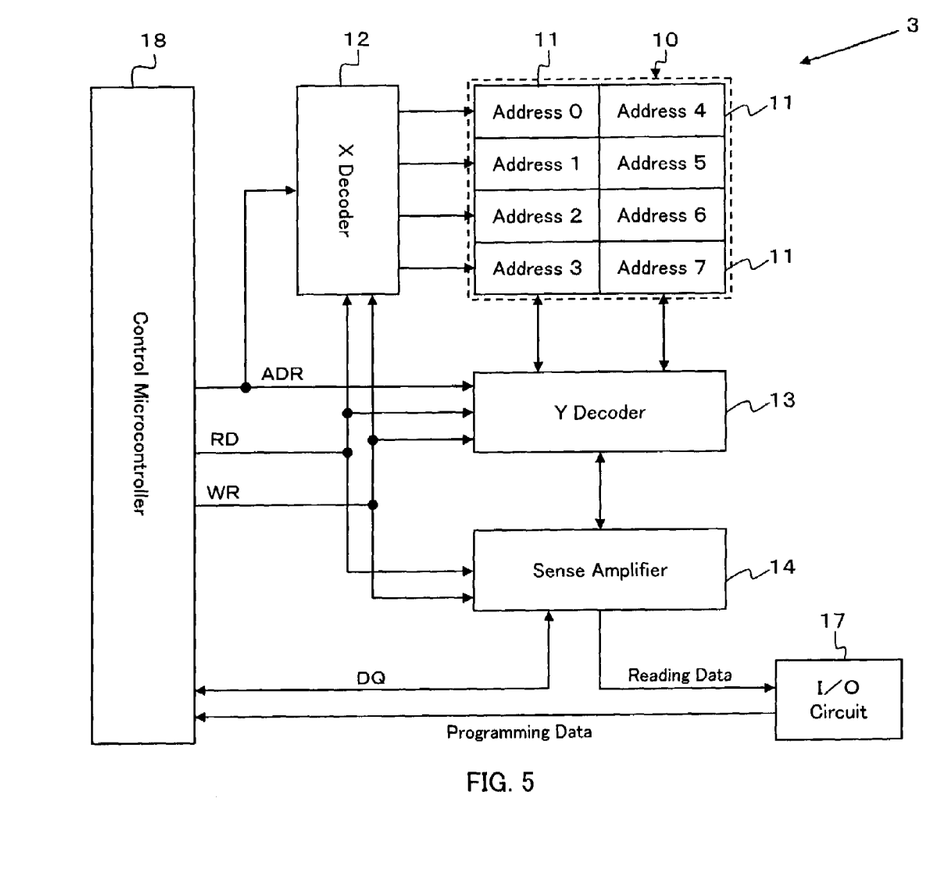
FIG. 5 is a block diagram showing a circuit configuration of a third embodiment of a semiconductor memory device according to the present invention.

As shown in FIG. 5, the inventive device 3 according to the third embodiment is configured to comprise: a memory array 10, an X decoder 12, a Y decoder 13, a sense amplifier 14, an I/O circuit 17, and a control microcontroller 18.

In the example shown in FIG. 5, it is assumed for the sake of simplifying the description that the memory array 10 constituting a storage region in the inventive device 3 includes eight unit data storage sections 11 with respective storage addresses 0 to 7. Each of the unit data storage sections 11 is capable of storing data with a word length of eight bits and formed by gatherings of eight memory cells (not shown) capable of storing one-bit data each.

The X decoder 12 and the Y decoder 13 select one unit data storage section 11 corresponding to a storage address designated by an ADR signal outputted from the control microcontroller 18.

The I/O circuit 17 outputs data read from the unit data storage section 11 via the sense amplifier 14, and inputs programming data to be sent to the control microcontroller 18.

The control microcontroller 18 generates an RD signal, a WR signal and an ADR signal to control a reading process, an erasure process and a programming process. The control microcontroller 18 also fetches programming data from the I/O circuit 17, or reads and programs data from and into the unit data storage section 11 through a DQ line via the sense amplifier 14.

Upon generation of the RD signal, data in the unit data storage section 11 corresponding to a selected storage address is read via the sense amplifier 14, to be sent to the I/O circuit 17 and the control microcontroller 18.

Upon generation of the WR signal, data outputted from the control microcontroller 18 to the DQ line is programmed into the unit data storage section 11 corresponding to a storage address designated by the ADR signal, via the sense amplifier 14.

Figure 6:
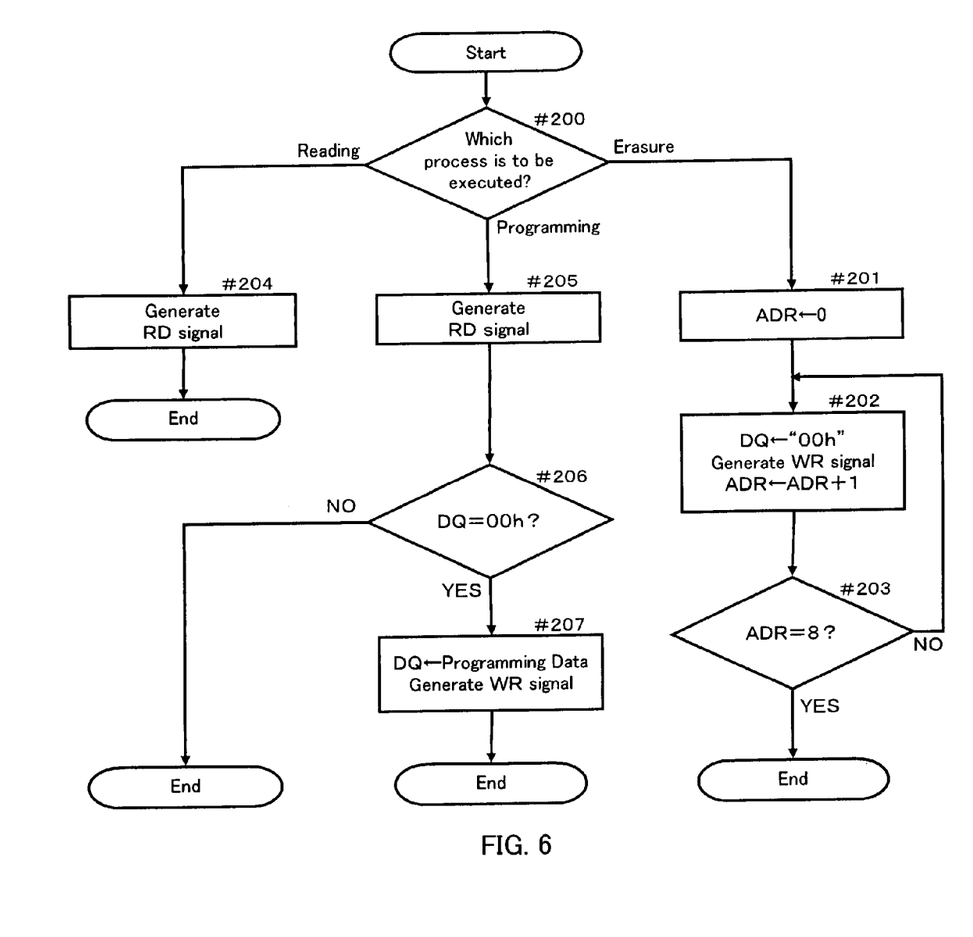
FIG. 6 is a flowchart for explaining an operation of a control microcontroller in the third embodiment of the semiconductor memory device according to the present invention.

FIG. 6 shows a flowchart of operations of the control microcontroller 18.

First, as the operation starts, a determination is made as to which of the processes (reading/erasure/programming) to execute (step #200).

When the process to execute is the erasure process, the control microcontroller 18 sequentially selects the unit data storage sections 11 with the addresses 0 to 7 while changing the ADR signal (steps #201 to #203). At this time, the WR signal is generated for each address of the ADR signal, to program data "00h" into the unit data storage section 11 corresponding to the storage address designated by the ADR signal (step #202). In the present embodiment, the programming data "00h" is the erasure data pattern.

When the process to execute is the reading process, the control microcontroller 18 generates the RD signal, and data read from the unit data storage section 11 corresponding to a storage address designated by the ADR signal is outputted from the I/O circuit 17 via the sense amplifier 14 (step #204).

When the process to execute is the programming process, the control microcontroller 18 generates the RD signal, and reads data from the unit data storage section 11 corresponding to a storage address designated by the address signal through a DQ line (step #205).

Whether the read data matches the erasure data pattern "00h" or not is confirmed (step #206). If the read data matches the erasure data pattern, the RD signal is released, and the programming data fetched from the I/O circuit 17 is outputted to the DQ line. After this output, the WR signal is generated to program the data into the unit data storage section 11 corresponding to the storage address designated by the ADR signal (step #207). In step #206, if the read data does not match the erasure data pattern, the RE signal is released to abandon the programming process.

The embodiments of the inventive device have been specifically described above. In the above embodiments, the word length of eight bits the unit data storage section 11 is capable of storing as one set of programming data is just exemplary, thus it is not limited to the word length of the semiconductor memory device 11 in the present invention. Further, the size of the memory array 10 forming the storage region is not limited to that in the above embodiments. Although the example of just one erasure block has been described in the above first and second embodiments, the storage region may be formed of more than one erasure blocks. Further, the case is assumed in the first and second embodiments in which the semiconductor memory device uses a flash memory cell, a nonvolatile storage element, as the memory cell, but the memory cell is not limited to the flash memory cell.

Moreover, the inventive device may be formed, as another embodiment, by mixing the memory array composed of the nonvolatile storage element in the first or second embodiment, with a memory array composed of another storage element in the third embodiment.

Therefore, according to present invention device, it is possible to protect already programmed data from programming error during data update, with no increase in area of a storage region.

Further, application of the data protection mechanism of the present invention to a flash memory having the mechanism of canceling the erasure operation alone enables prohibition of erasure of overwriting at a storage address where the data has been programmed, thereby providing a nonvolatile semiconductor memory device in which the data can be added but not be changed, can be realized.

Although the present invention has been described in terms of the preferred embodiments, it will be appreciated that various modifications and alterations might be made by those skilled in the art without departing from the spirit and scope of the invention. The invention should therefore be measured in terms of the claims which follow.

What is claimed is:

1. A semiconductor memory device comprising:
   a unit data storage section configured by one or more data storage elements; and a data protection mechanism for inhibiting programming of data into the unit data storage section, wherein data stored in the unit data storage section is, after erased, formed into a specific erasure data pattern, and the data protection mechanism inhibits programming of data into the unit data storage section when the data stored in the unit data storage section is not in the erasure data pattern.

2. The semiconductor memory device according to claim 1, wherein the data storage element is configured by a nonvolatile storage element.

3. A semiconductor memory device comprising:

a unit data storage section configured by one or more data storage elements;

an erasing mechanism for erasing data stored in the unit data storage section to form the data after erased into a specific erasure data pattern; and a data protection mechanism for inhibiting programming of data into the unit data storage section when the data stored in the unit data storage section is not in the erasure data pattern.

4. The semiconductor memory device according to claim 3, wherein the data storage element is configured by a nonvolatile storage element.

* * * * *